US005709262A

United States Patent [19]

Sikes

[11] Patent Number: 5,709,262
[45] Date of Patent: Jan. 20, 1998

[54] ELECTRONIC VALVE FOR COOLING SEMICONDUCTOR PROCESSING EQUIPMENT

[75] Inventor: Roger A. Sikes, Austin, Tex.

[73] Assignee: Advanced Micro Devices, Inc., Sunnyvale, Calif.

[21] Appl. No.: 286,405

[22] Filed: Aug. 5, 1994

Related U.S. Application Data

[63] Continuation-in-part of Ser. No. 16,036, Feb. 10, 1993, abandoned.

[51] Int. Cl.[6] .................................................. F24H 3/00
[52] U.S. Cl. .......................... 165/47; 137/870; 137/869; 251/14
[58] Field of Search ............................. 165/47; 251/14; 137/868, 870, 876

[56] References Cited

U.S. PATENT DOCUMENTS 3,310,284  3/1967  Inaba et al. ............................ 251/14

FOREIGN PATENT DOCUMENTS 948295  1/1964  United Kingdom ..................... 251/14

*Primary Examiner*—A. Michael Chambers
*Attorney, Agent, or Firm*—Kevin L. Daffer; Conley, Rose & Tayon

[57] ABSTRACT

An improved system and apparatus is provided for cooling the energy source used in powering various types of semiconductor processing devices. The improved cooling system uses a solenoid valve which is electrically controlled by the processing equipment during times in which the energy source is on, or during times in which the user manually or automatically programs valve activation. The solenoid valve can be easily and readily retrofitted to any pre-existing processing device which uses an energy source and which can be electrically activated by the processing device or a user interface panel. An activated solenoid valve allows coolant to flow through the energy source in order to maintain optimal performing temperature of the energy source. An inactive valve will reroute coolant away from the energy source to ensure longevity of the system and to minimize condensation upon the energy source electrical components.

16 Claims, 3 Drawing Sheets

ELECTRONIC VALVE FOR COOLING SEMICONDUCTOR PROCESSING EQUIPMENT

This application is a C-I-P of Ser. No. 08/016,036 filed Feb. 10, 1993, now abandoned.

BACKGROUND OF THE INVENTION

1. Field of the Invention

This invention relates to semiconductor processing equipment and more particularly to an improved system and apparatus for cooling semiconductor processing equipment.

2. Background of the Relevant Art

Manufacture of a semiconductor often requires large power supplies. The power supplies are used to perform many wafer processing steps. For example, energy in the form of a light source is needed during lithography. High current ion sources are often needed during ion beam deposition. High voltage supplies are generally placed on the target during sputter deposition. Still further, chemical vapor deposition (CVD) requires a large radio frequency (RF) supply to enhance the chemical vapor plasma. Even still further, large power supplies are often used during the etching process and more particularly during plasma etching. Accordingly, "processing equipment" or "processing device" as defined herein includes any processing apparatus or step utilizing an energy source for the manufacture of a semiconductor or integrated circuit. Processing equipment can be used during any of the wafer fabrication operations including cleaning, epitaxy, oxidation, diffusion, implantation, lithography, etching, deposition, etc.

Large power supplies often develop large amounts of heat during operation. A build up of heat may cause the power supply to skew or drift out of specification. Prolonged heating may eventually cause power supply failure. In order to prevent improper operation, processing equipment often employs a system for cooling the supply. The cooling system includes a coolant circulated between a chiller and the power supply. The system is used to send cooled coolant to the supply and receives warm coolant from the supply. The coolant thereby exchanges or sinks heat away from the energy supply. As defined herein, "coolant" includes any fluid media having high thermal conductivity. The fluid must be capable of movement through a relatively small-diameter conduit and must flow readily over a mass transfer surface within the chiller.

Problems associated with circulating coolant through an energy supply are manyfold. In some cases there exists no device which can readily regulate the coolant flow. As such, coolant may circulate through the energy supply when it is not needed. For example, coolant may circulate through the supply when the supply is inactive, or is cool. Continuous circulation through a cool supply may bring about condensation within the supply and thereby cause moisture ingress into the supply's electrical components. Furthermore, continuous circulation may shorten the lifetime of the chiller and the coolant pumping mechanism. In an effort to prevent continuous circulation, many recent circulating systems use a regulator valve placed between the chiller and energy supply. The valve routes coolant through the supply during times in which the supply is active. Unfortunately, conventional valves have short lifetimes partially due to their mode of operation. Conventional processing device cooling valves are generally air-actuated, and regulate coolant flow through the energy supply in response to air pressure input. Air, which originates from a remote source, may often leak into the coolant supply whenever the integrity of the valve, which separates coolant from air, deteriorates. After a certain number of openings and closings of the regulatory valve, the valve may loose its seating capacity and eventually allow air to leak into the coolant or vice versa. Once air is allowed to leak into the coolant, the coolant pumping mechanism may become destroyed and furthermore the mass transfer capability (thermal expulsion ability) may be lessened.

While it is important that the energy supply is cooled to allow its optimal performance, it is also important that an air-driven or air-actuated cooling system and problems associated therewith be avoided. It would be advantageous that the coolant circulation system be one which applies coolant only during energy supply operation and only in regulated amounts. It would also be advantageous that the circulation system would be both simple and easily retrofitted to existing processing equipment using actuation or motive means which already exists for that equipment.

SUMMARY OF THE INVENTION

The problems outlined above are in large part solved by the improved cooling system and unit of the present invention. That is, the cooling system and unit hereof utilizes electrical input and electromagnetic force arising therefrom to regulate coolant into and from an energy source of a semiconductor processing device. Electrical input, which can be derived directly from the processing device, is used to supply actuation input energy to the coolant system without using conventional air-driven input. Electrical input signals sent into the circulating system are easily obtained from the processing device or energy source. Accordingly, the present invention can ensure circulating coolant placed through the energy source only when the source is electrically active, or only when the operator or thermostat deems coolant is necessary. The need for air as the motive force is eliminated, and the disadvantages associated with previous circulatory systems using air-driven valves is also eliminated. Further, complex air pumping mechanisms and associated leaks are also eliminated.

Broadly speaking, the present invention contemplates an improved cooling unit. The cooling unit comprises a semiconductor processing device coupled to receive energy from an energy source. A pair of conduits are coupled between the energy source and a chiller. A solenoid valve is coupled to the conduit and is adapted to receive a coolant from the chiller through one of the pair of conduits. The solenoid is further adapted to discharge, to the energy source, coolant into the same one of the pair of conduits during a first time period in which the valve is electrically activated. A suitable semiconductor processing device includes a semiconductor etcher and more particularly a semiconductor plasma etcher.

The solenoid valve according to the present invention achieves sufficient electromagnetic force to turn on a flow path between the chiller and the energy source. Energy necessary to turn on the flow path is derived from current and/or voltages received from the semiconductor processing device. Therefore, the coolant circulation system hereof is readily retrofitted to any processing device which operates or is programmed via an electrical signal. The same electrical signals can be easily coupled from an electronic controller associated with the processing device to control the solenoid valve. The solenoid valve comprises a helical conductive coil extending along a central axis and a ferrous metal core placed along the central axis and capable of movement at least partially within the coil. A valve seat is indirectly connected to one end of the core, and electrical input to the coil causes movement of the valve seat to an open position. Accordingly, electrical input generally available within the processing device can be routed to the coil in order to cause the valve to open and allow coolant flow therethrough. If electrical input ceases, then a biasing spring connected to the valve causes the valve to close thereby blocking subsequent flow into the energy source.

The present invention further contemplates a system for selectively cooling an energy source of a semiconductor etching device. The system includes a mechanism for routing cooling through the energy source during a first time period and for routing coolant away from the energy source during a second time period. Upon receipt of an electrical input, the helical coil causes electromagnetic force to open a valve seat allowing coolant to flow between the chiller and the energy source during the first time period. Conversely, when the electrical input ceases, a spring, which is connected to the valve seat, biases the valve seat to a closed position to prevent subsequent coolant flow into the energy source during the second time period. Accordingly, first time period ensures coolant flow into the energy source, and second time period ensures that the coolant is not directed through the energy source. Preferably, first time period corresponds to the time in which the energy source is activated, and second time period corresponds to when the energy source is generally inactive. First and second time periods can be manually manipulated by the operator or automatically manipulated by electrical signals sent from the processing device via an electronic controller. The electronic controller includes a programmable circuit and a digital input/output circuit. The digital input/output circuit is adapted to deliver a programmable current to the coil during the first time period.

BRIEF DESCRIPTION OF THE DRAWINGS

Other objects and advantages of the invention will become apparent upon reading the following detailed description and upon reference to accompanying drawings in which.

Figure 1:
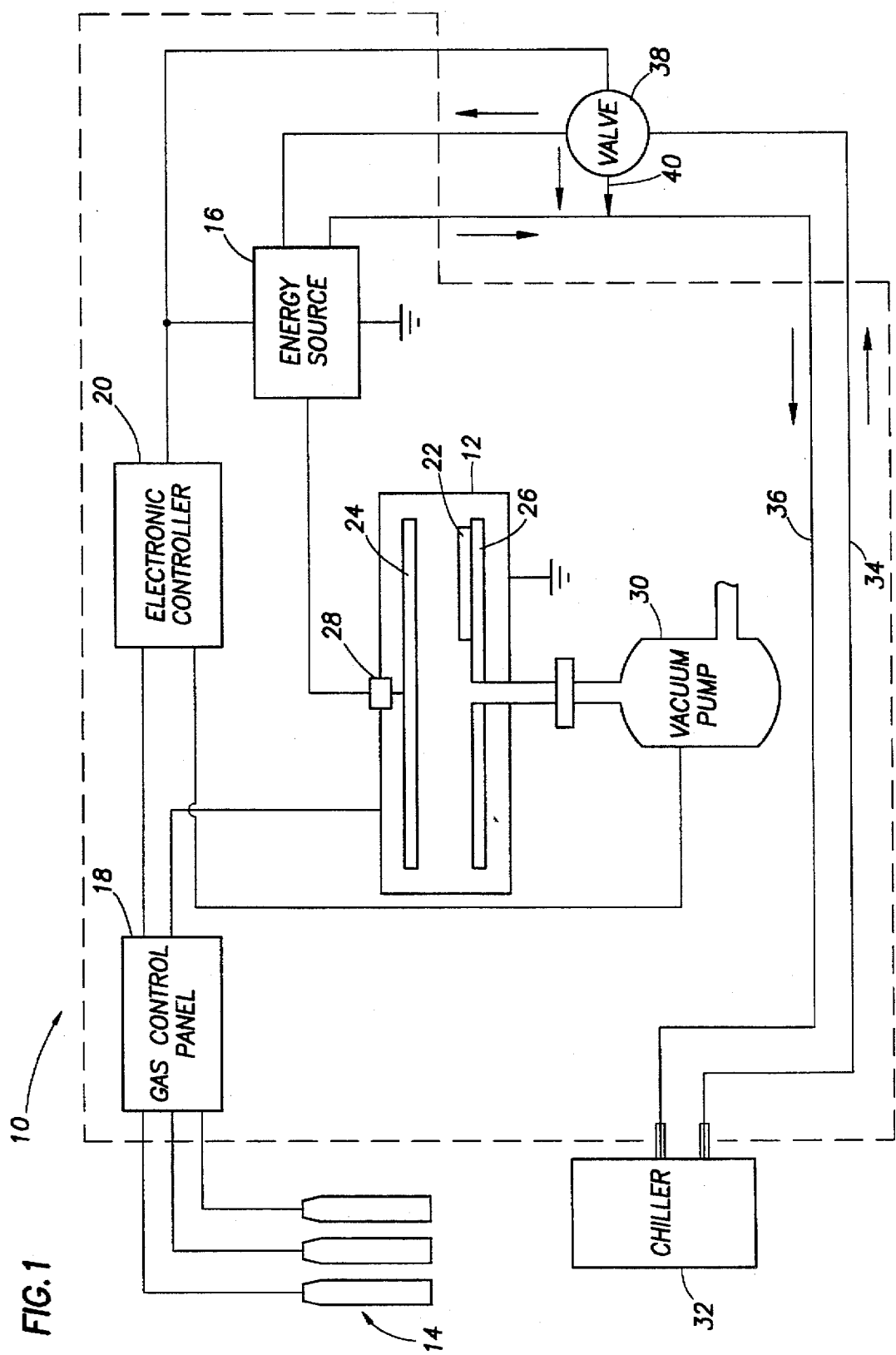
FIG. 1 is a block diagram of a semiconductor processing device with a cooling system according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates an exemplary semiconductor processing device 10. There are various types of processing devices 10 capable of being retrofitted with the present invention. The devices can perform numerous manufacturing operations and include a semiconductor etcher device as shown in FIG. 1. Etching is but one example of a processing device which can utilize a cooling unit or system of the present invention. As described above, any processing device which uses an energy source can be retrofitted by the cooling unit hereof. Processing device 10 includes a wafer processing chamber 12, for example, a plasma etching chamber. Chamber 12 is coupled to receive gas from a gas supply 14 and power from an energy source 16. A gas control panel 18, generally fixed to the outer surface of processing device 10, allows the user to manually select a gas or a combination of gases to input into chamber 12. Gas control panel 18 and energy source 16 can be programmably controlled by an electronic controller 20. Controller 20 receives programmable input and, based upon that input, activates gas control panel 18 and energy source 16 to allow various types of gas and energy magnitude to be placed into and upon chamber 12. Excluding solenoid valve 38 and the electrical connections thereto, an exemplary processing device 10 (such as a wafer autoetcher) can be obtained from LAM Research Corp. of Fremont, Calif., model no. 490/590. Model no. 490/590, in accordance with the structure and procedure defined below, is retrofitted to accommodate an electrically activated valve 38 as well as the electrical connection between valve 38, energy source 16 and controller 20. Further, valve 38 is actuated on demand and only when needed during times in which energy source 16 requires cooling and not at other times.

The exemplary device, or autoetch device, includes an RF power source operating at 100 watts to 1500 watts during normal plasma etch or reactive ion etch operation. The autoetcher also includes a gas control panel on the outer surface of the autoetcher which can allow the user to manually input a preferred etchant into the chamber. A suitable etchant includes a halogen species, various Freons®, and/or hydrogen/oxygen-based gases. Various other types of gases can also be used depending upon the semiconductor material to be etched. Energy source 16, operating at energies approaching 1500 watts, can oftentimes become heated to a level exceeding 100° C. Prolonged operation at high temperature may cause energy drift and inaccurate etching of wafer 22 placed within the chamber. It is imperative that during plasma etching or reactive ion etching (RIE), that energy supplied by an RF generator or source 16 be constant and steady throughout the etching operation. It is also preferable that energy source operation not exceed approximately 20° C. It is therefore advantageous that coolant within the range of 10° C. to 20° C. be routed into the source during operation.

Plasma, which is generated between electrodes 24 and 26 of an exemplary etcher must be maintained within a close energy tolerance level. DC voltages from the RF generator is excluded by capacitive coupling the RF source to electrode 24. Any drift or stray in DC voltage may overcome the capacitor 28 causing intolerable damage to wafer 22. Any change whatsoever in the plasma energy level between electrodes 24 and 26 may also cause damage to wafer 22. Therefore, it becomes important that energy source 26, used in any type of processing device 10 including an etcher, be closely maintained to a specific operating temperature to optimize its output and prolong its lifetime. Again, using an etching example, ions and free radicals generated in the plasma diffuse to electrode 26 and the surface of wafer 22 where they then react with the material being etched to form volatile products. The volatile products can then be quickly and easily evacuated or pumped away from wafer 22 via vacuum pump 30.

A system necessary for cooling energy source 16 includes a chiller 32, first conduit 34, second conduit 36, and valve 36. Coolant is routed through first and second conduits 34 and 36 in the direction indicated by the arrows.

Valve 38 is coupled to first conduit 34 to receive cooled coolant from chiller 32. Chiller 32 is of common design and utilizes either active or passive techniques for expelling heat from the coolant as the coolant is transferred over a heat or mass exchange surface. Freon® from gas supply 14 can be compressed and expanded, as in normal refrigeration, to cool coolant passed through chiller 32. Valve is activated by an electronic signal sent from electronic controller 20. Upon activation, valve 38 allows coolant in first conduit 34 to flow through the valve and into energy source 16. If valve 38 is deactivated, then it will route coolant from first conduit 34 to second conduit 36, via flow path 40, and back into chiller 32 as shown. Whenever controller 20 produces electrical stimulus, generally during activation of energy source 16 or during programmable or manual generation, valve 38 will allow coolant flow into energy source 16. Conversely, whenever source 16 is deactivated or whenever the user manually or programmably desires, valve 38 will produce path 40 thereby bypassing or preventing coolant flow through source 16.

It is appreciated from the present invention that electronic controller 20 may pre-exist within processing device 10. Controller 20 includes any controller which sends electronic stimulus to device 10 and/or energy source 16. Controller 20 can be a programmable controller and, for example, can also programmably and/or automatically control gas control panel 18 as well as vacuum pump 30 to achieve full automated processing. Controller 20 includes a digital input/output (DIO) circuit adapted to receive input from a programmable circuit or central processing unit (CPU) having, for example, an AT/XT IBM®-compatible bus architecture. A suitable DIO circuit can be obtained, for example, from Keithley Corp., Taunton Mass., part no. PIO-12, having a programmable peripheral interface such as found in part no. 8255 obtained from Intel Corp., Santa Clara, Calif. An exemplary electronic controller 20 useable in an autoetcher manufactured by LAM Research Corp. is designated as having an output pin from the DIO denoted as "J3" to receive output signal to energy source 16. J3 pin can also be connected to valve 38 as shown in FIG. 1. It is appreciated, however, that any form of DIO circuit useable between a programmable device and a peripheral can be used to achieve the function of controller 20, and that J3 pinout of the LAM Research Corp. autoetcher is but only one example of the conductor point which can be tapped into and routed to a relay 82 (see FIG. 4) which controls valve 38. An exemplary autoetcher manufactured by LAM Research Corp. uses 24 V DC signals to actuate internal relays within the machine. Relay 82 is chosen to operate at 24 V DC as well, in order for a select signal sent over J3 pinout to interface directly to the relay. If an off-the-shelf controller using a DIO card described above is used, then the controller will typically operate at 5 V DC, and relay 82 is preferrably chosen having compatible 5 V DC operation. If necessary, the 24 V DC signals within the LAM autoetcher can be easily voltage divided to operate a 5 V controller and associated DIO card.

Figure 2:
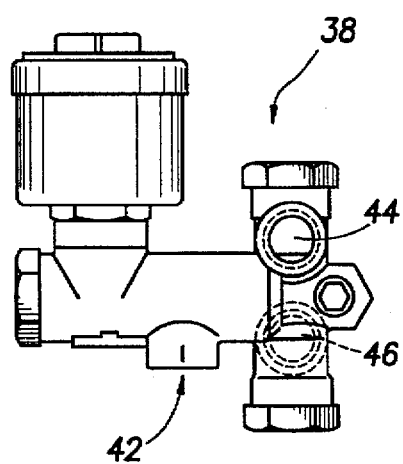
FIG. 2 is an elevational view of a solenoid valve adapted for receiving electrical input according to the present invention.

Turning now to FIG. 2, an exemplary three-way solenoid valve 38 is shown in elevational view. Valve 38 can be configured to allow coolant to enter port 42 and exit either first output port 44 or second output port 46 (shown in dashed line to indicate its position on the opposing, non-visible side). Input port 42 receives coolant from first conduit 34 (shown in FIG. 1) and, depending upon the solenoid position, will output that coolant to first output port 44 or second output port 46. The first output port 44 can be connected to first conduit 34, while second output port 46 can be connected to second conduit 36 via flow path 40 (shown in FIG. 1). A suitable solenoid valve 38 can be obtained from Automatic Switch Co., Florham Park, N.J., part no. 8300D68RF.

Figure 3:
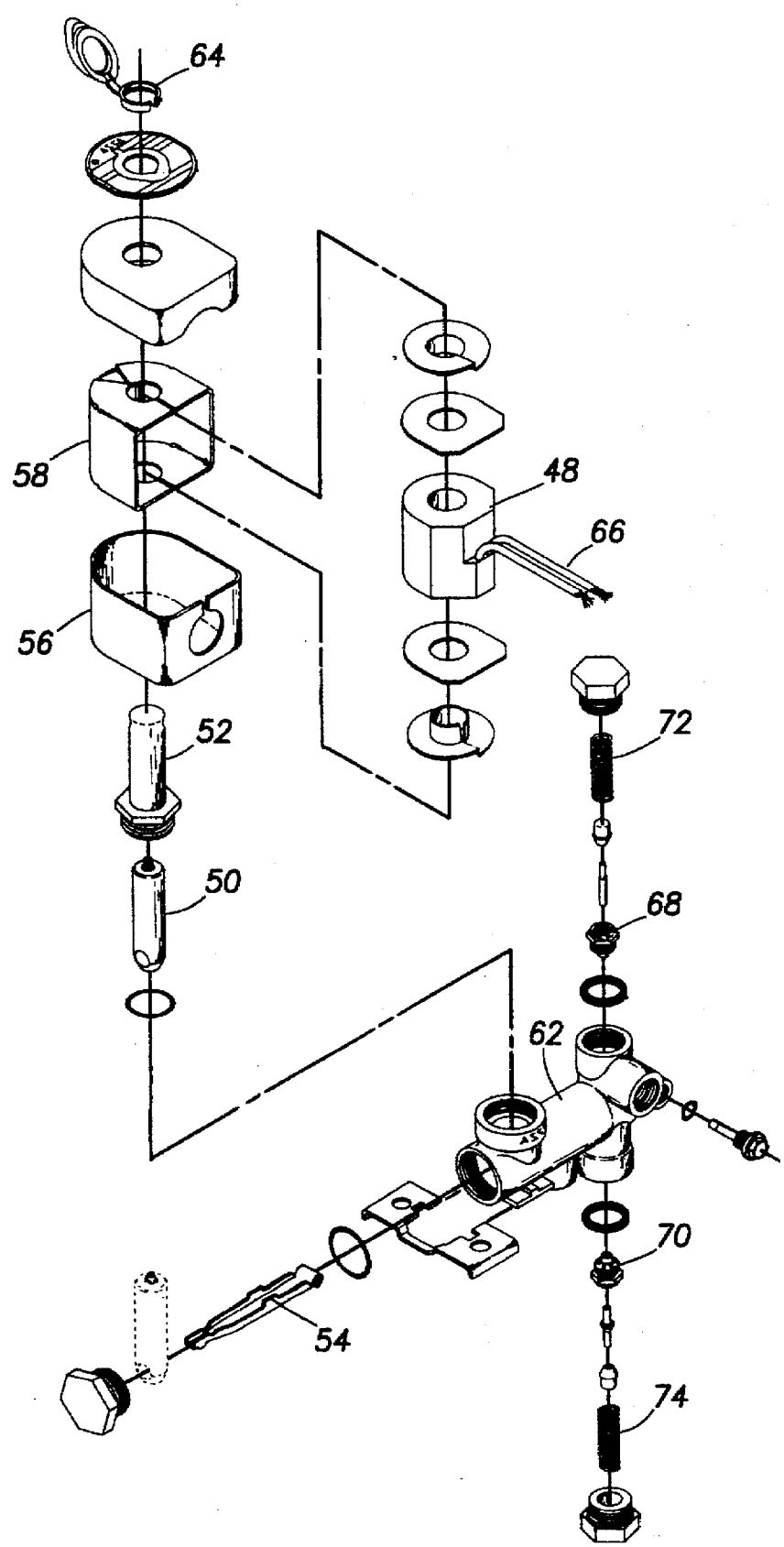
FIG. 3 is an exploded view of the solenoid valve of FIG. 2 according to the present invention.

Referring to FIG. 3, an exploded view of valve 38 is shown. Valve 38 generally includes a mechanism which translates electrical energy applied to coil 48 into linear mechanical motion of armature or core 50. Core 50 moves within solenoid base 52 and against one end of valve lever 54. The entire coil and core assembly is contained within housing 56 and yoke 58, and is secured to valve body 62 via retaining cap 64. Upon receipt of electrical input at conductor ends 66 of coil 48, valve lever 54 will pivot upward at the end nearest core 50. Downward movement of valve lever 54 will cause upper valve seat 68 to separate from valve body 62. Upward movement of valve lever 54 will cause separation of valve seat 68 from body 62 and allow a coolant flow path between input port 42 and one output port, preferably first output port 44. Conversely, absence of an electrical input at conductor ends 66 will cause valve lever 54 to pivot downward in the direction of lateral biasing force exerted by upper spring 72. Upper spring 72, being of larger biasing force than lower spring 72, ensures valve seat 68 is not separated from valve body 62 absent electrical energy at conductor ends 66. Further, spring 72 ensures valve seat 70 is separated from valve body 62 whenever electrical energy is absent at conductor ends. Separation of seat 70 from body 62 provides coolant flow from input port 42 to second output port 46. Upper valve seat 68 will not open until lower valve seat 70 is closed, and vice versa.

Figure 5:
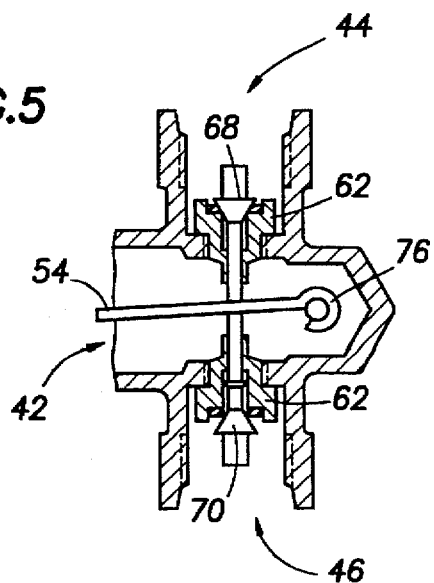
FIG. 5 is a cross-sectional view of an electrically inactive solenoid valve according to the present invention.

The operation of valve 38 is fairly simple. Referring now to FIG. 5, an electrically inactive valve is shown. Valve lever 54 remains in a downward tilt about a pivot point 76 caused by biasing force of spring 72 (shown in FIG. 3). Spring 72 preferably includes a larger biasing force than spring 74. Spring 72, of larger axial biasing force than spring 74, ensures upper valve seat 68 is firmly and sealingly placed against the inner surface of valve body 62. Pressure by upper spring 72 also forces lower valve seat 70 to separate from valve body 62. Such separation allows coolant to flow from input port 42 to second output port 46.

Figure 6:
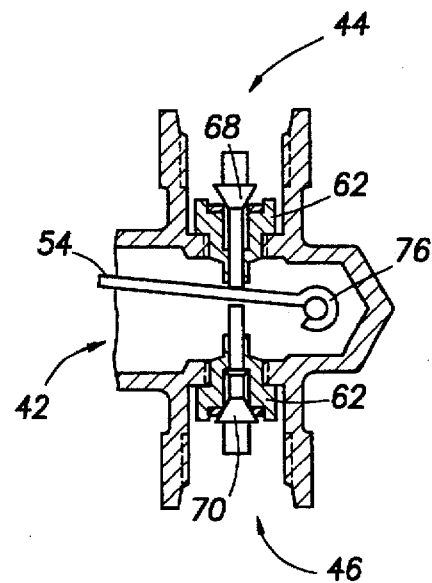
FIG. 6 is a cross-sectional view of an electrically active solenoid valve according to the present invention.

Referring now to FIG. 6, an energized or electrically active valve is shown. Upon receiving electrical input on conductors 66, coil 48 actuates core 50 causing connected valve lever 54 to tilt upward about pivot point 76. The electromagnetic force upon core 50 is sufficient to overcome the biasing force of upper spring 72. As such, upper valve seat 68 is forced to separate from valve body 62. Separation or unseating of upper valve seat 68 allows fluid from input port 42 to flow to first output port 44 (shown in FIG. 2). FIGS. 1, 2, 5 and 6 illustrate the routing of coolant from a first conduit and maintaining the routing through the first conduit during a first time period in which valve 38 is electrically activated (activation which causes input port of first conduit to be connected to first output port of first conduit). Conversely, routing of coolant from first conduit to second conduit (bypassing source 16) occurs during a second time period in which valve 38 is electrically de-energized or inactive. Inactive valve 38 allows biasing spring 72 to open a flow path between input port 44 of first conduit to second output port 46 of second conduit.

Figure 4:
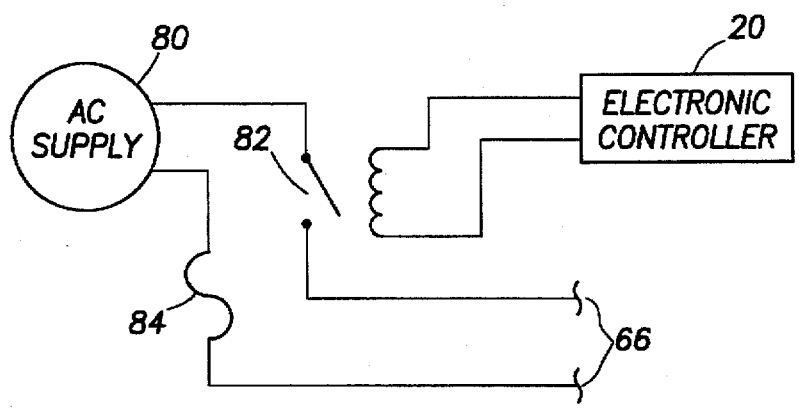
FIG. 4 is a block diagram of the power supply used to electrically control the solenoid valve according to the present invention.

Referring now to FIG. 4, input conductors 66 of coil 48 are shown capable of receiving input from power supply 80. Power supply 80 is preferably an alternating current (AC) power supply and can be 120 volt AC. Whenever relay 82 is connected, power supply presents necessary voltage to energize valve 38. A suitable relay 82 can be a single pole, double throw relay manufactured by Magnecraft, Inc. of Northbrook, Ill., part no. W388CQX-3. Relay 82 is activated by input from electronic controller 20. Whenever controller 20 generates an electrical output, relay 82 will cause direct connection between conductors 66 and power supply 80 provided fuse 84 is not blown. A suitable fuse can be a one ampere fuse of common design and structure.

It is appreciated from the foregoing description that electronic controller 20 includes any controller associated with the electronic control of a processing device 10. Controller 20 emits electrical signals which can indicate activation and deactivation of energy source 16. Furthermore, controller 20 can be programmably manipulated to allow keyboard interface and cathode ray tube (CRT) monitoring of controller operation which includes any operation necessary to achieve wafer processing. An exemplary electronic controller is described hereinabove and useable in a LAM Research Corp. autoetcher model no. 490/590. However, various other types of electronic controllers can be used and fall within the scope of the present invention. As such, any controller which emits electronic signals indicative of energy source and/or processing device operation can be used to also emit the same signals to valve 38. Pre-existing hardware and software for processing equipment can be readily adapted and/or retrofitted to actuate the cooling unit of the present invention.

It will be appreciated to those skilled in the art having the benefit of this disclosure that this invention is believed to be capable of applications with numerous types of processing devices. Furthermore, it is also to be understood that the form of the invention shown and described is to be taken as only one of many exemplary embodiments, the embodiment shown is a presently preferred embodiment. Various modifications and changes may be made without departing from the spirit and scope of the invention as set forth in the claims. It is intended that the following claims be interpreted to embrace all such modifications and changes.

What is claimed is:

1. A cooling unit for a semiconductor processing device comprising:
    a semiconductor processing device coupled to receive energy from an energy source;
    a pair of conduits coupled between said energy source and a chiller;
    a solenoid valve coupled to said conduits and adapted to receive a coolant from said chiller through one of said pair of conduits, and further adapted to discharge said coolant to said energy source during a first time period; and
    an electronic controller means electrically coupled to said solenoid valve for electrically activating said valve during said first time period in which said energy source is active, whereby solely an electrical function and mode of operation is used to achieve communication from said controller and operation of said valve.

2. The cooling unit as recited in claim 1, wherein said semiconductor processing device comprises a semiconductor etcher.

3. The cooling unit as recited in claim 2, wherein said semiconductor etcher comprises a semiconductor plasma etcher.

4. The cooling unit as recited in claim 1, wherein said coolant comprises a fluid of high thermal conductivity.

5. The cooling unit as recited in claim 1, wherein said solenoid valve comprises:
    a helical conductive coil extending along a central axis;
    a ferrous metal core placed along said central axis and capable of movement at least partially within said coil;
    a valve seat indirectly connected to one end of said core; and
    current means connected to said coil for moving said valve seat to an open position.

6. The cooling unit as recited in claim 1, wherein said solenoid valve is adapted to receive said coolant through one of said pair of conduits and further adapted to discharge said coolant into the other of said pair of conduits during a second time period in which said energy source is electrically inactive.

7. A system for selectively cooling an energy source of a semiconductor processing device, comprising:
    a semiconductor processing device coupled to receive energy from an energy source;
    means for routing a coolant through said energy source during a first time period and for routing said coolant away from said energy source during a second time period, said routing means comprises:
    a chiller having a mass transfer surface capable of expelling heat from said coolant;
    a first conduit coupled to receive coolant from said chiller to said energy source;
    a second conduit coupled to receive coolant from said energy source to said chiller;
    a solenoid valve having an input port and a first and second output ports, wherein said input port is connected to said first conduit, said first output port is connected to said first conduit, and said second output port is connected to said second conduit;
    an electronic controller means coupled to said solenoid valve for electrically forming a first path between said input port and said first output port during a first time period, and for electrically forming a second path between said input port and said second output port during a second time period, whereby solely an electrical function and mode of operation is used to achieve communication from said controller and operation of said valve.

8. The system as recited in claim 7, wherein said semiconductor processing device comprises a semiconductor etcher.

9. The system as recited in claim 8, wherein said semiconductor etcher comprises a semiconductor plasma etcher.

10. The system as recited in claim 9, wherein said solenoid valve comprises:
    a helical conductive coil extending along a central axis;
    a ferrous metal core placed along said central axis and capable of movement at least partially within said coil;
    a valve seat indirectly connected to one end of said core;
    current means connected to said coil for moving said valve seat to an open position; and
    a spring connected to said valve seat for biasing said valve seat to a closed position.

11. The system as recited in claim 8, wherein said conductive coil comprises a conductor having one end of said conductor connected to said electronic controller means.

12. The system as recited in claim 11, wherein said open position allows said coolant to flow along said path formed between said input port and said first output port.

13. The system as recited in claim 11, wherein said closed position allows said coolant to flow along said path formed between said input port and said second output port.

14. The system as recited in claim 11, wherein said controller means comprises:
- a programmable circuit; and
- a digital input/output circuit adapted to programmably deliver said current means to said coil during said first time period.

15. A system for selectively cooling an energy source of a semiconductor etching device, comprising:
- a semiconductor plasma etching device coupled to receive energy from an energy source;
- means for routing a coolant through said energy source during a first time period and for routing said coolant away from said energy source during a second time period, said routing means comprises:
  - a chiller having a mass transfer surface capable of expelling heat from said coolant;
  - a first conduit coupled to receive coolant from said chiller to said energy source;
  - a second conduit coupled to receive coolant from said energy source to said chiller;
  - a solenoid valve having an input port and a first and second output ports, wherein said input port is connected to said first conduit, said first output port is connected to said first conduit, and said second output port is connected to said second conduit; said solenoid valve further comprises:
    - a helical conductive coil extending along a central axis;
    - a ferrous metal core placed along said central axis and capable of movement at least partially within said coil;
    - a valve seat indirectly connected to one end of said core;
    - a spring connected to said valve seat for biasing said valve seat to a closed position to allow a coolant path between said input port and said second output port during said second time period; and
  - an electronic controller means coupled to a relay switch for allowing a current means to be sent to said coil and causing said valve seat to move to an open position to allow a coolant path between said input port and said first output port during said first time period.

16. The system as recited in claim 15, wherein said controller means comprises:
- a programmable circuit; and
- a digital input/output circuit adapted to programmably deliver said current means to said coil during said first time period.

* * * * *